United States Patent
Lee

[11] Patent Number: 5,929,675
[45] Date of Patent: Jul. 27, 1999

[54] POWER APPLYING CIRCUIT WITH INITIAL RESET PULSE FOR SEMICONDUCTOR MEMORY

[75] Inventor: Soo Seong Lee, Kyungsangbook-Do, Rep. of Korea

[73] Assignee: LG Semicon Co., Ltd., Chungcheongbuk-Do, Rep. of Korea

[21] Appl. No.: 08/887,361

[22] Filed: Jul. 2, 1997

[30] Foreign Application Priority Data

Aug. 23, 1996 [KR] Rep. of Korea ............. 96-35006

[51] Int. Cl.⁶ ............................................. H03L 7/00
[52] U.S. Cl. .................. 327/143; 327/198; 327/392; 327/398; 327/399; 327/261; 327/285
[58] Field of Search ................................. 327/142, 143, 327/198, 545, 392, 398, 399, 403, 415, 285, 261; 365/189.05, 220, 221, 230.08

[56] References Cited

U.S. PATENT DOCUMENTS

| | | | |
|---|---|---|---|
| 4,611,126 | 9/1986 | Miller | 307/64 |
| 4,631,420 | 12/1986 | Hollis et al. | 327/198 |
| 4,985,641 | 1/1991 | Nagayama et al. | 327/143 |
| 5,473,271 | 12/1995 | Little et al. | 327/108 |
| 5,731,720 | 3/1998 | Suzuki et al. | 327/143 |

FOREIGN PATENT DOCUMENTS 1-194710  8/1989  Japan ........................... 327/143

*Primary Examiner*—Timothy P. Callahan
*Assistant Examiner*—Jung Ho Kim
*Attorney, Agent, or Firm*—Morgan, Lewis & Bockius LLP

[57] ABSTRACT

A power applying circuit for an internal logic circuit includes a plurality of basic power applying units coupled to the internal logic circuit in parallel, each of the basic power applying units including a logic gate unit outputting a pulse in response to two input signals having a time interval with respect to each other, and a transmission gate coupled to the logic gate unit and receiving the pulse.

9 Claims, 2 Drawing Sheets

POWER APPLYING CIRCUIT WITH INITIAL RESET PULSE FOR SEMICONDUCTOR MEMORY

This application claims the benefit of Application No. 35006/1996 filed in Korea on Aug. 23, 1996, which is hereby incorporated by reference.

BACKGROUND OF THE INVENTION

1. Field of the Invention

The present invention relates to a power applying circuit, and more particularly, to an improved power applying circuit capable of clearing an undesired information stored in a memory device of an internal logic circuit.

2. Description of the Related Art

Generally, when power is applied to a product, an unnecessary arbitrary information is stored in the memory devices disposed in an internal logic circuit under each initial condition. Since the initial condition of the product cannot easily be cleared by changing a design or process, an erroneous operation is carried out for a time and then enters a stable operating condition.

Conventionally, when power is applied to a product, a detecting circuit is used to detect the applied power. In the detecting circuit, a capacitor and a resistor are employed. The capacitor and resistor are formed by diffusion. Such a diffusion process has a normal deviation of 10 to 20%. Therefore, to reduce the deviation in the process, a method of designing a large resistor has been adopted. However, the resistor designed in such a method occupies a large chip area.

In case of a gate array among application specific integrated circuit (ASIC) products, a capacitor or a resistor cannot be formed in an array. That is, according to the gate array, after wafers having logic element gates are fabricated in advance, a three-stage mask step is performed for a metal wiring to complete a fabrication process, but the capacitor or resistor cannot be arranged by a metal process. In addition, a power applying circuit which detects a power activation is maintained in a non-active condition after power is applied thereto. Consequently, an unnecessary initial information of the memory device in the internal logic circuit cannot be cleared or reset, which is disadvantageous in conventional power applying circuits.

SUMMARY OF THE INVENTION

Accordingly, the present invention is directed to a power applying circuit that substantially obviates one or more of the problems due to limitations and disadvantages of the related art.

An object of the present invention is to provide an improved power applying circuit capable of clearing or resetting unnecessary information stored in memory devices in an internal logic circuit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the power applying circuit includes an inverter for receiving a voltage source, a plurality of inverters connected in series to the inverter, an AND gate for receiving an output signal from the last inverter among the plurality of inverters through one side thereof and the voltage source through the other side and then ANDing both signals, another inverter for receiving the dataNDed in the AND gate, and a transmission gate which is turned on in accordance with a momentary pulse generated by the AND gate and outputs a voltage source to a clearing or resetting terminal in the internal logic circuit.

In another aspect of the present invention, a power applying circuit for an internal logic circuit comprises a plurality of basic power applying units coupled to the internal logic circuit in parallel, each of the basic power applying units including a logic gate unit outputting a pulse in response to two input signals having a time interval with respect to each other, and a transmission gate coupled to the logic gate unit and receiving the pulse.

In another aspect of the present invention, a power applying circuit for an internal logic circuit comprises a plurality of power applying units coupled to the internal logic circuit in parallel, each of the power applying units, a first inverter coupled to a voltage source and receiving a voltage signal, a plurality of inverters connected in series to the first inverter, an AND gate having first and second input terminals, the AND gate receiving an output signal from a last one of the plurality of inverters at the first input terminal and the voltage signal at the second input terminal, the AND gate outputting a pulse in response to the output signal and the voltage signal, a second inverter receiving the pulse from the AND gate and inverting the pulse, and a transmission gate receiving the inverted pulse from the second inverter at a first input terminal and the pulse from the AND gate at a second input terminal, the transmission gate being activated in accordance with the pulse from the AND gate, and outputs A second voltage signal to a reset terminal of the internal logic circuit.

In a further aspect of the present invention, a power applying circuit for an internal logic circuit comprises a plurality of power applying units coupled to the internal logic circuit in parallel, each of the power applying units including a first buffer coupled to a voltage source and receiving a voltage signal, a plurality of buffers connected in series to the first buffer, a logic gate unit having first and second input terminals, the logic gate receiving an output signal from a last one of the plurality of buffers at the first input terminal and the voltage signal at the second input terminal, the logic gate unit outputting a pulse in response to the output signal and the voltage signal, a second buffer receiving the pulse from the logic unit gate, and a transmission gate coupled to the second buffer at a first input terminal and the pulse from the logic gate unit at a second input terminal, the transmission gate being activated in accordance with the pulse from the logic gate unit, and outputs a second voltage signal to a reset terminal of the internal logic circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3A is a waveform of an input signal to one input terminal of an AND gate, FIG. 3B is a waveform of an input signal to another input terminal of the AND gate, and FIG. 3C is a waveform of an output signal from the AND gate.

DETAILED DESCRIPTION OF THE PREFERRED EMBODIMENTS

Reference will now be made in detail to the preferred embodiments of the present invention, examples of which are illustrated in the accompanying drawings.

Figure 1:
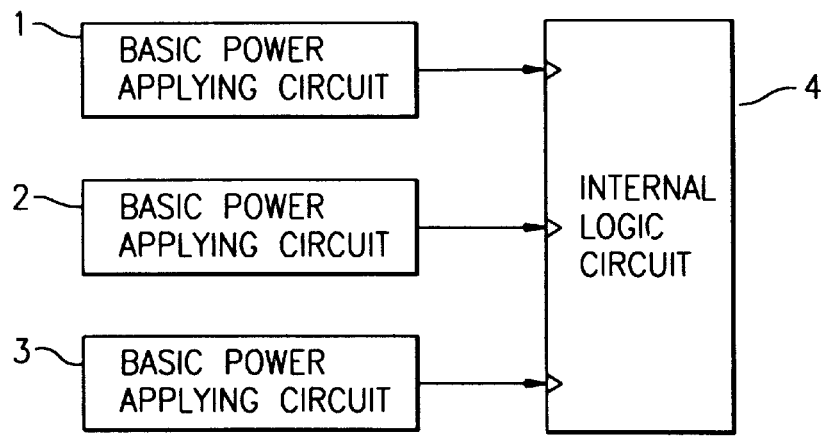
FIG. 1 is a power applying circuit diagram according to the present invention.

As shown in FIG. 1, in a power applying circuit according to the present invention, output signals from a plurality of basic power applying circuits 1,2,3 are applied to an internal logic circuit 4.

Figure 2:
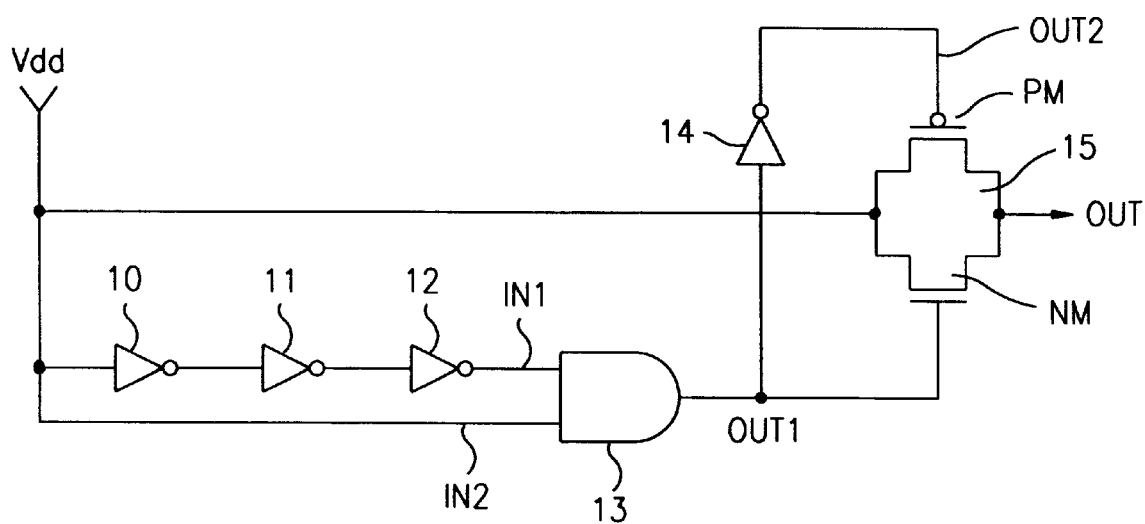
FIG. 2 is a detailed circuit diagram of FIG. 1.

FIG. 2 is a detailed circuit diagram of a basic power applying circuit of the present invention. The basic power applying circuit includes an inverter 10 for receiving a voltage source (Vdd) and a plurality of inverters 11,12 connected in series to the inverter 10. An AND gate 13 receives an output signal (IN1) from the last inverter 12 among the plurality of inverters 11,12 at one input terminal thereof and the voltage source (Vdd)(IN2) at the other input terminal. A logical AND operation is performed on the two signals, IN1 and IN2. Another inverter 14 receives the output data from the AND gate 13. A transmission gate 15 turns on in accordance with a momentary pulse (OUT1) generated by the AND gate. The transmission gate 15 outputs the voltage source (Vdd) to a clear or reset terminal in an internal logic circuit 4, shown in FIG. 1.

Here, an output signal (OUT2) from the inverter 14 is applied to the gate of a PMOS transistor (PM) of the transmission gate 15, and the output signal (OUT1) is applied to the gate of an NMOS transistor (NM).

The operation of the power applying circuit according to the present invention will now be described.

First, since the voltage source (Vdd) is delayed for a predetermined time (propagation delay) through the inverters 10,11,12, respectively, the output signal (IN1) from the last inverter 12 is applied to one input terminal of the AND gate 13. The voltage source (Vdd) (IN2) is applied to the other input terminal of the AND gate 13. Accordingly, a certain time interval (or delay) exists between the input signals IN1 and IN2. That is, the input signal (IN1) applied to the one input terminal of the AND gate 13 delayed by the three inverters 10,11,12 is input later than the voltage source (Vdd)(IN2) applied to the other input terminal of the AND gate 13.

Figure 3A:
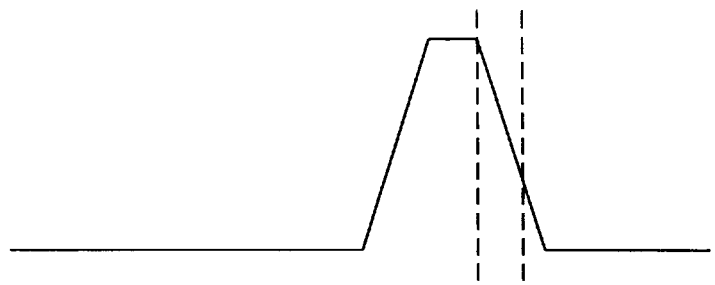
FIGS. 3A through 3C are waveform diagrams of the circuit in FIG. 1, where
Figure 3B:
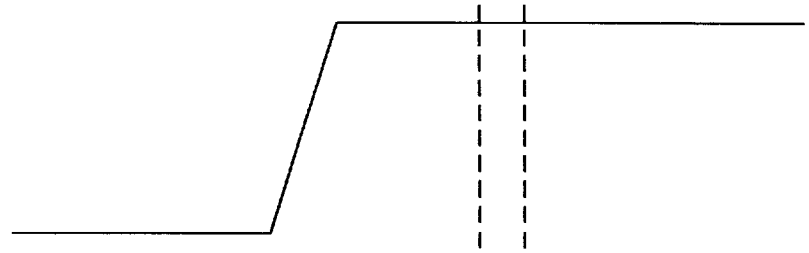
Figure 3C:
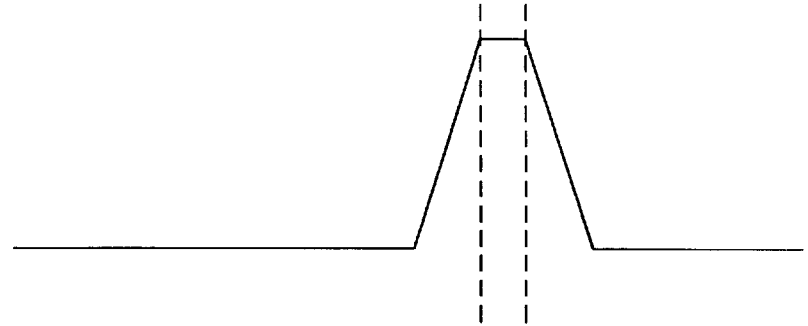

As shown in FIGS. 3A and 3B, due to the time interval between the two input signals (IN1,IN2), the AND gate generates a momentary pulse (OUT1), as shown in FIG. 3C. Thus, the transmission gate 15 is momentarily turned on in accordance with the pulse (OUT1).

The output signal (OUT) transmitted through the transmission gate 15 is input to the clear or reset terminal in the internal logic circuit 4 so that when power is applied, the memory device of the internal logic circuit 4 may clear or reset the preserved information under an arbitrary initial condition.

As described above, as the momentary pulse (OUT1) is generated in accordance with the AND gate 13 by using the delay from the inverters 10,11,12 and as the pulse is applied to the switch control terminal of the transmission gate 15, the output signals from the transmission gate 15 are applied to the clear or reset terminal in the internal logic circuit 4 to clear an arbitrarily latched initial information.

Then, since the transmission gate 15 in the power applying circuit is maintained in an off state after the momentary pulse is generated, the circuit enters a non-active condition, which is impossible to clear or reset. After an initial operation of the internal logic circuit, the memory devices in the internal logic circuit is cleared or reset by a clearing or resetting circuit of the internal logic circuit, if necessary.

Thus, in the power applying circuit of the present invention, an undesired information stored in a memory device of an internal logic circuit is cleared by outputting a momentary pulse to the internal logic circuit when power is applied to a host product and contributes to an initial stabilization of the product.

Accordingly, the power applying circuit has the effect of easily clearing an initial unnecessary information stored in the memory devices in an internal logic circuit by using, for example, a plurality of inverters, an AND gate, and a transmission gate.

It will be apparent to those skilled in the art that various modifications and variations can be made in the power applying circuit of the present invention without departing from the spirit or scope of the invention. Thus, it is intended that the present invention cover the modifications and variations of this invention provided they come within the scope of the appended claims and their equivalents.

What is claimed is:

1. A power applying circuit for an internal logic circuit comprising:

a plurality of basic power applying units coupled to the internal logic circuit, each of the basic power applying units including:
a logic gate unit outputting a pulse in response to two input signals offset in time from each other; and
a transmission gate coupled to the logic gate unit and receiving the pulse,
wherein the logic gate unit includes:
a plurality of inverters connected in series; and
an AND gate connected to the inverters at one input terminal and a voltage source connected to another input terminal.

2. The power applying circuit according to claim 1, wherein the plurality of inverters function as a delay circuit and are coupled to the voltage source.

3. The power applying circuit according to claim 1, wherein the plurality of inverters are coupled to the voltage source.

4. The power applying circuit according to claim 1, wherein the the transmission gate includes a PMOS transistor and an NMOS transistor.

5. A power applying circuit for an internal logic circuit comprising:

a plurality of basic power applying units coupled to the internal logic circuit, each of the basic power applying units including:
a logic gate unit outputting a pulse in response to two input signals offset in time from each other; and
a transmission gate coupled to the logic gate unit and receiving the pulse,
wherein the logic gate unit includes:
a delay circuit having a plurality of inverters connected in series and coupled to a voltage source; and a logic circuit connected to the delay circuit at one input terminal and to the voltage source at another input terminal, the logic circuit including an AND gate connected to the plurality of inverters through the one input terminal and to the voltage source through the another input terminal.

6. A power applying circuit for an internal logic circuit comprising a plurality of power applying units coupled to the internal logic circuit, each of the power applying units including:

a first inverter coupled to a voltage source and receiving a voltage signal;

a plurality of inverters connected in series to the first inverter;

an AND gate having first and second input terminals, the AND gate receiving an output signal from a last one of the plurality of inverters at the first input terminal and the voltage signal at the second input terminal, the AND gate outputting a pulse in response to the output signal and the voltage signal;

a second inverter receiving the pulse from the AND gate and inverting the pulse; and a transmission gate receiving the inverted pulse from the second inverter at a first input terminal and the pulse from the AND gate at a second input terminal, the transmission gate being activated in accordance with the pulse from the AND gate, and outputs a second voltage signal to a reset terminal of the internal logic circuit.

7. The power applying circuit according to claim 6, wherein the output signal from the last one of the plurality of inverters is a delayed signal of the voltage signal.

8. A power applying circuit for an internal logic circuit comprising a plurality of power applying units coupled to the internal logic circuit, each of the power applying units including:

a first buffer coupled to a voltage source and receiving a voltage signal;

a plurality of buffers connected in series to the first buffer;

a logic gate unit having first and second input terminals, the logic gate receiving an output signal from a last one of the plurality of buffers at the first input terminal and the voltage signal at the second input terminal, the logic gate unit outputting a pulse in response to the output signal and the voltage signal;

a second buffer receiving the pulse from the logic unit gate; and a transmission gate coupled to the second buffer at a first input terminal and the pulse from the logic gate unit at a second input terminal, the transmission gate being activated in accordance with the pulse from the logic gate unit, and outputting a second voltage signal to a reset terminal of the internal logic circuit, wherein the logic gate unit includes:
a plurality of inverters connected in series; and
an AND gate connected to the inverters at one input terminal and the voltage source connected to another input terminal.

9. The power applying circuit according to claim 8, wherein the output signal from the last one of the plurality of buffers is a delayed signal of the voltage signal.

* * * * *